(12) United States Patent
Sherman

(10) Patent No.: US 8,323,737 B2
(45) Date of Patent: *Dec. 4, 2012

(54) SEQUENTIAL CHEMICAL VAPOR DEPOSITION

(75) Inventor: Arthur Sherman, Menlo Park, CA (US)

(73) Assignee: ASM International N.V. (NL)

( * ) Notice: Subject to any disclaimer, the term of this patent is extended or adjusted under 35 U.S.C. 154(b) by 0 days.

This patent is subject to a terminal disclaimer.

(21) Appl. No.: 12/177,730

(22) Filed: Jul. 22, 2008

(65) Prior Publication Data

US 2008/0280039 A1    Nov. 13, 2008

Related U.S. Application Data

(60) Division of application No. 10/692,243, filed on Oct. 22, 2003, now Pat. No. 7,410,671, which is a division of application No. 09/866,156, filed on May 24, 2001, now Pat. No. 6,652,924, which is a division of application No. 09/291,807, filed on Apr. 14, 1999, now Pat. No. 6,342,277, which is a continuation-in-part of application No. 08/699,002, filed on Aug. 16, 1996, now Pat. No. 5,916,365.

(51) Int. Cl.
   *C23C 16/00*    (2006.01)

(52) U.S. Cl. ......... 427/255.37; 427/255.27; 427/255.29; 427/255.31

(58) Field of Classification Search ................ 427/248.1
See application file for complete search history.

(56) References Cited

U.S. PATENT DOCUMENTS

| | | | |
|---|---|---|---|
| 3,422,321 A | * | 1/1969 | Tombs ........................... 257/411 |
| 3,660,179 A | | 5/1972 | Desmond et al. |
| 4,058,430 A | | 11/1977 | Suntola et al. |
| 4,282,267 A | | 8/1981 | Küyel |
| 4,389,973 A | | 6/1983 | Suntola et al. |
| 4,604,304 A | | 8/1986 | Faraone et al. |
| 4,675,089 A | | 6/1987 | Lory et al. |
| 4,747,367 A | | 5/1988 | Posa |
| 4,761,269 A | | 8/1988 | Conger et al. |

(Continued)

FOREIGN PATENT DOCUMENTS

EP    0 442 490 A1    8/1991

(Continued)

OTHER PUBLICATIONS

Read, Hiroshima University, Research Center for Nanodevices and Systems,obtained Aug. 200.*

(Continued)

*Primary Examiner* — David Turocy
(74) *Attorney, Agent, or Firm* — Knobbe, Martens, Olson & Bear, LLP

(57)    ABSTRACT

The present invention provides for sequential chemical vapor deposition by employing a reactor operated at low pressure, a pump to remove excess reactants, and a line to introduce gas into the reactor through a valve. A first reactant forms a monolayer on the part to be coated, while the second reactant passes through a radical generator which partially decomposes or activates the second reactant into a gaseous radical before it impinges on the monolayer. This second reactant does not necessarily form a monolayer but is available to react with the monolayer. A pump removes the excess second reactant and reaction products completing the process cycle. The process cycle can be repeated to grow the desired thickness of film.

18 Claims, 4 Drawing Sheets

U.S. PATENT DOCUMENTS

| | | | |
|---|---|---|---|
| 4,767,494 A | 8/1988 | Kobayashi | |
| 4,845,049 A | 7/1989 | Sunakawa | |
| 4,851,095 A | 7/1989 | Scobey et al. | |
| 4,859,627 A | 8/1989 | Sunakawa | |
| 4,876,218 A | 10/1989 | Pessa et al. | |
| 4,900,591 A * | 2/1990 | Bennett et al. | 427/255.17 |
| 4,935,661 A | 6/1990 | Heinecke et al. | |
| 4,993,357 A | 2/1991 | Scholz | |
| 5,060,595 A | 10/1991 | Ziv et al. | |
| 5,071,670 A | 12/1991 | Kelly | |
| 5,130,269 A | 7/1992 | Kitahara et al. | |
| 5,166,092 A | 11/1992 | Mochizuki et al. | |
| 5,225,366 A | 7/1993 | Yoder | |
| 5,256,244 A | 10/1993 | Ackerman | |
| 5,270,247 A | 12/1993 | Sakuma et al. | |
| 5,278,435 A | 1/1994 | Van Hove | |
| 5,281,274 A | 1/1994 | Yoder | |
| 5,291,066 A | 3/1994 | Neugebauer | |
| 5,294,286 A | 3/1994 | Nishizawa et al. | |
| 5,300,186 A | 4/1994 | Kitahara | |
| 5,306,666 A | 4/1994 | Izumi | |
| 5,321,713 A | 6/1994 | Khan | |
| 5,330,610 A | 7/1994 | Eres | |
| 5,356,673 A | 10/1994 | Schmitt et al. | |
| 5,374,570 A | 12/1994 | Nasu | |
| 5,395,791 A | 3/1995 | Cheng | |
| 5,443,033 A | 8/1995 | Nishizawa | |
| 5,443,647 A | 8/1995 | Aucoin et al. | |
| 5,458,084 A | 10/1995 | Thorne | |
| 5,458,733 A | 10/1995 | Tessmer et al. | |
| 5,459,108 A | 10/1995 | Doi et al. | |
| 5,469,806 A | 11/1995 | Mochizuki | |
| 5,480,818 A | 1/1996 | Matsumoto et al. | |
| 5,483,919 A | 1/1996 | Yokoyama et al. | |
| 5,484,664 A | 1/1996 | Kitahara et al. | |
| 5,496,582 A | 3/1996 | Mizutani | |
| 5,496,597 A * | 3/1996 | Soininen et al. | 427/584 |
| 5,503,105 A | 4/1996 | Sakuma | |
| 5,573,981 A | 11/1996 | Sato | |
| 5,618,395 A | 4/1997 | Gartner | |
| 5,641,984 A | 6/1997 | Aftergut | |
| 5,693,139 A | 12/1997 | Nishizawa et al. | |
| 5,707,880 A | 1/1998 | Aftergut | |
| 5,711,811 A | 1/1998 | Suntola | |
| 5,730,802 A | 3/1998 | Ishizumi | |
| 5,769,950 A | 6/1998 | Takasu et al. | |
| 5,855,680 A | 1/1999 | Soininen | |
| 5,916,365 A | 6/1999 | Sherman | |
| 6,064,077 A | 5/2000 | Sandaresan | |
| 6,127,275 A | 10/2000 | Flamm | |
| 6,200,893 B1 | 3/2001 | Sneh | |
| 6,203,613 B1 | 3/2001 | Gates et al. | |
| 6,270,572 B1 | 8/2001 | Kim et al. | |
| 6,342,277 B1 | 1/2002 | Sherman | |
| 6,426,273 B1 | 7/2002 | Yanagida | |
| 6,464,779 B1 * | 10/2002 | Powell et al. | 117/89 |
| 6,464,782 B1 | 10/2002 | Sivaramakrishnam | |
| 6,616,986 B2 | 9/2003 | Sherman | |
| 6,652,924 B2 | 11/2003 | Sherman | |
| 7,410,671 B2 | 8/2008 | Sherman | |
| 7,682,657 B2 | 3/2010 | Sherman | |
| 7,771,533 B2 | 8/2010 | Tois et al. | |
| 2001/0028922 A1 | 10/2001 | Sandhu | |
| 2003/0188682 A1 | 10/2003 | Tois et al. | |

FOREIGN PATENT DOCUMENTS

| | | | |
|---|---|---|---|
| EP | 0 526 779 A1 | 2/1993 | |
| EP | 1 167 567 A1 | 1/2001 | |
| JP | 03-111571 | 5/1991 | |
| JP | 03-119721 | 5/1991 | |
| JP | 05-062913 | 3/1993 | |
| JP | 05-074713 | 3/1993 | |
| JP | 05-102189 | 4/1993 | |
| JP | 05-299412 | 11/1993 | |
| JP | 06-314654 | 11/1994 | |
| JP | 06-333853 | 12/1994 | |
| JP | 07-058100 | 3/1995 | |
| JP | 08-250434 | 9/1996 | |
| JP | 09-260373 | 10/1997 | |
| JP | 11-087341 | 3/1999 | |
| JP | 11-176770 | 7/1999 | |
| JP | 2000-144421 | 5/2000 | |
| JP | 2000-160342 | 6/2000 | |
| JP | 2000-228400 | 8/2000 | |
| WO | WO 93/24243 | 12/1993 | |
| WO | WO 9324243 A1 * | 12/1993 | |
| WO | WO 00/63957 | 10/2000 | |

OTHER PUBLICATIONS

Nakamura et al., "Atomic-Layer Deposition of SiO2 by Remote Plasma CVD," Research Center for Integrated Systems, Hiroshima University, 1 page.*

Catherine et al., Plasma Deposition of Aluminum Oxide Films, J. Elec. Mat., 1988, vol. 17 (2), pp. 99 127-134.

Ehle et al., Low Temperature Aluminum Oxide Deposition Using Trimethylaluminum, J. Elec. Mat., 1982, vol. 12(3), pp. 587-601.

Asikainen et al., "AFM and STM Studies on In2O3 and ITO Films Deposited by Atomic Layer Epitaxy", Applied Surface Science, 1996, vol. 99, pp. 91-98.

Asikainen et al., "Growth of Indium-Tin-Oxide Thin Films by Atomic Layer Epitaxy", J. Electrochem. Soc., Oct. 1995, vol. 142, Issue 10, pp. 3538-3541.

Fujii et al., "Atomic Layer Epitaxy of AlAs Using Trimethylamine-Alane and Amino-As", Appl. Phys. Lett., Mar. 22, 1993, vol. 62, Issue 12, pp. 1420-1422.

Herman et al., "Atomic Layer Epitaxy of Cd1-xMnxTe Grown on CdTe(111)B Substrates", Journal of Crystal Growth, 1984, vol. 66, pp. 480-483.

Ihanus et al., "AFM Studies on ZnS Thin Films Grown by Atomic Layer Epitaxy", Applied Surface Science, 1997, vol. 120, pp. 43-50.

Juppo et al., "Deposition of Copper Films by an Alternate Supply of CuCl and Zn", J. Vac. Sci. Technol., Jul./Aug. 1997, vol. 15, Issue 4, pp. 2330-2333.

Khan et al., "GaN/AlN Digital Alloy Short-Period Superlattices by Switched Atomic Layer Metalorganic Chemical Vapor Deposition", Appl. Phys. Lett., Dec. 20, 1993, vol. 63, Issue 25, pp. 3470-3472.

Koleske et al., "Growth of Si on Si(100) via H/Cl Exchange and the Effect of Interfacial Boron", J. Appl. Phys., Nov. 1, 1992, vol. 72, Issue 9, pp. 4073-4082.

Koleske et al., "Precursors for Si Atomic Layer Epitaxy: Real Time Adsorption Studies on Si(100)", Appl. Phys. Lett., Oct. 12, 1992, vol. 61, Issue 15, pp. 1802-1804.

Kukli et al., "Atomic Layer Epitaxy Growth of Aluminum Oxide Thin Films from a Novel Al(CH3)2Cl Precursor and H2O", J. Vac. Sci. Technolo., Jul./Aug. 1997, vol. 15, Issue 4, pp. 2214-2218.

Kukli et al., "In Situ Study of Atomic Layer Epitaxy Growth of Tantalum Oxide Thin Films from Ta(OC2H5)5 and H2O", Applied Surface Science, 1997, vol. 112, pp. 236-242.

Kumagai, H. et al., *Jpn. J. Appl. Phys.*, vol. 33, p. 7086, (1994).

Leskela, M. et al., J. Less Common Metals, vol. 153, p. 219, (1989).

Leskela, M. et al., Mat. Res. Soc. Symp. Proc., vol. 222, p. 315, (1991).

Nishizawa et al., "Molecular Layer Epitaxy of Silicon", Journal of Crystal Growth, 1990, vol. 99, pp. 502-505.

Nishizawa et al., "Silicon Molecular Layer Epitaxy", J. Electrochem. Soc., Jun. 1990, vol. 137, Issue 6, pp. 1898-1904.

Nishizawa, J. et al., J. Electrochem. Soc., vol. 132, p. 1197, (1985).

Nishizawa, J. et al., J. Electrochem. Soc., vol. 134, p. 945, (1987).

Nishizawa, J. et al., J. Vac. Sci. Technol., vol. A 4(3), p. 706 (1986).

Ozeki et al., "Adsorption Mechanisms of Tertiarybutylarsine on Ga- and As-rich GaAs(001) Surfaces", Applied Surface Science, 1997, vol. 112, pp. 110-117.

Pessa et al., "Atomic Layer Epitaxy and Characterization of CdTe Films Grown on CdTe (100) Substrates", J. Appl. Phys., Oct. 1983, vol. 54, Issue 10, pp. 6047-6050.

Pessa et al., "Characterization of Surface Exchange Reactions Used to Grow Compound Films", Appl. Phys. Lett., Feb. 1, 1981, vol. 38, Issue 3, pp. 131-132.

Pessa et al., "Epitaxial Growth and Electronic Structure of CdTe Films", J. Vac. Sci. Technol., Apr.-Jun. 1984, vol. 2, Issue 2, pp. 418-422.

Pessa et al., "Growth of Cd1-xMnx Te Films with 0<x<0.9 by Atomic Layer Epitaxy", Appl. Phys. Lett., Sep. 15, 1984, vol. 45, Issue 6, pp. 646-648.

Ritala et al., "Atomic Layer Epitaxy Growth of TiN Thin Films", J. Electrochem. Sco., Aug. 1995, vol. 142, Issue 8, pp. 2731-2737.

Ritala et al., "Effects of Intermediate Zinc Pulses on Properties of TiN and NbN Films Deposited by Atomic Layer Epitaxy", Applied Surface Science, 1997, vol. 120, pp. 199-212.

Ritala et al., "Enhanced Growth Rate in Atomic Layer Epitaxy of Indium Oxide and Indium-Tin Oxide Thin Films", Electrochemical and Solid-State Letters, 1998, vol. 1, Issue 3, pp. 156-157.

Ritala et al., "Surface Roughness Reduction in Atomic Layer Epitaxy Growth of Titanium Dioxide Thin Films", Thin Solid Films, 1994, vol. 249, pp. 155-162.

Ritala, M. et al., Thin Solid Films, vol. 250, p. 72, (1994).

Ritala, M., et al., Chem. Mater, vol. 5, p. 1174, (1993).

Ritala, M., et al., Thin Solid Films, vol. 228, p. 32, (1993).

Sakuma et al., "Comparative Study of Self-Limiting Growth of GaAs Using Different Ga-alkyl Compounds: (CH3)3Ga, C2H5(CH3)2Ga, and (C2H5)3Ga", J. Appl. Phys., Dec. 1, 1990, vol. 68, Issue 11, pp. 5660-5664.

Sherman, "Chemical Vapor Deposition for Microelectronics", Noyes Publication, 1987, New Jersey.

Sugahara et al., "Atomic Hydrogen-Assisted ALE of Germanium", Applied Surface Science, 1995, vol. 90, pp. 349-356.

Sugahara et al., "Modeling of Germanium Atomic-Layer-Epitaxy", Applied Surface Science, 1997, vol. 112, pp. 176-186.

Sugahara, S. et al., Appl. Surf. Sci. vol. 82/83, p. 380, (1994).

Suntola, "Surface Chemistry of Materials Deposition at Atomic Layer Level", Applied Surface Science, 1996, vol. 100/101, pp. 391-398.

Tanninen et al., Structural Characterization of Thin ZnS Films by X-Ray Diffraction, Thin Solid Films, 1982, vol. 90, pp. 339-343.

Tischler et al., "Growth and Characterization of Compound Semiconductors by Atomic Layer Epitaxy", Journal of Crystal Growth, 1986, vol. 77, pp. 89-94.

Yao et al., "Photoluminescence Properties of ZnSe Single Crystalline Films Grown by Atomic Layer Epitaxy", Appl. Phys. Lett., Jun. 9, 1986, vol. 48, Issue 23, pp. 1615-1616.

U.S. Appl. No. 11/948,794, filed Nov. 30, 2007.

Office Action for U.S. Appl. No. 11/948,794 dated Jan. 21, 2009.

Office Action for U.S. Appl. No. 11/948,794 dated May 27, 2010.

Office Action for U.S. Appl. No. 11/948,794 dated Nov. 12, 2010.

Office Action for U.S. Appl. No. 11/948,794 dated Sep. 28, 2009.

Mahajan et al., "Si Atomic Layer Epitaxy Based on Si2H6 and Remote He Plasma Bombardment", Thin Solid Films, 1993, vol. 225, pp. 177-182.

20A-ZC-1, Miyamoto et al., "High-Fluidity Deposition of SiN by Cryogenic Remote Plasma CVD,", Research Center for Integrated Systems and Faculty of Engineering, Hiroshima University, pp. 1 page.

20A-ZC-2, Gotou et al., "Atomic-Layer Deposition of SiN by Remote Plasma CVD,", Research Center for Integrated Systems, Hiroshima University, pp. 2 pages.

20A-ZC-3, Nakamura et al., "Atomic-Layer Deposition of SiO2 by Remote Plasma CVD,", Research Center for Integrated Systems, Hiroshima University,, pp. 1 page.

Aarik, J. et al., "Effect of Growth Conditions on Formation of TiO2-II Thin Films in Atomic Layer Deposition Process", Appl. Surf. Sci, 1997, vol. 112, pp. 259.

Abeles et al., "Amorphous Semiconductor Superlattices", Physical Review Letters, 1983, vol. 51, pp. 2003-2006, No. 21.

Ahonen, M. et al., "A Study of ZnTe films Grown on Glass Substrates Using an Atomic Layer Evaporation Method", Thin Solid Films, 1980, vol. 65, pp. 301.

Ait-Lhouss, M. et al., "Atomic Layer Epitaxy of GaAs from Tertiarybutylarsine and Triethylgallium,", J. Appl. Phys, 1995, vol. 78, pp. 5834.

Akazawa, H., "Characterization of Self-limiting SiH2Cl2 Chemisorption and Photon-stimulated Desorption as Elementary Steps for Atomic-layer Epitaxy", Phys. Rev., 1996, vol. B 54, pp. 10917.

"Proceedings of the Third International Atomic Layer Epitaxy Symposium,", Applied Surface Science,, 1994, vol. 82/83.

Ares, R. et al., "Growth Mechanisms in Atomic Layer Epitaxy of GaAs", J. Appl. Phys, 1998, vol. 83, pp. 3390.

Asikainen, T. et al., "Growth of In2O3 Thin Films by Atomic Layer Epitaxy,", J. Electrochem. Soc., 1994, vol. 141, pp. 3210.

*ASM America, Inc., and Arthur Sherman, and ASM International, N.V. v. Genus, Inc.*, 401 F.3d 1340, 74 U.S.P.Q.2d 1211, Fed.Cir.(Cal.), Mar. 16, 2005.

ASM's Claim Construction Reply Brief Regarding the '365 Patent, Case No. C 01 2190 EDL, filed on May 24, 2002.

Bedair, S.M., "Atomic Layer Epitaxy Deposition Process", J. Vac. Sci. Technol. B., 1994, vol. 12, pp. 179, No. 1.

Bedair, S.M. et al., "Atomic Layer Epitaxy of III-V Binary Compounds", Appl. Phys. Lett., 1985, vol. 47, pp. 51.

Bermudez, V.M., "Simple Efficient Technique for Exposing Surfaces to Hydrogen Atoms", J. Vac. Sci. Technol., 1996, vol. A14,, pp. 2671.

Buchan, N.I. et al., "Epitaxial Growth of GaAs with (C2H5)2GaCl and AsH3 in a Hot Wall System", J. Cryst. Growth, 1991, vol. 107, pp. 331.

Chen, W.K. et al., "Metalorganic Chemical Vapor Deposition of indium Phosphide by Pulsing Precursors,", Appl. Phys. Lett., 1989, vol. 55,, pp. 987.

Claim Construction of United States Patents Nos. 6,015,590, 5,916,365 and 5,294,568; filed Aug. 15, 2002.

Dapkus, P.D. et al., "Atomic Layer Epitaxy for the Growth of Heterostructures", Proc. Intern. Electron. Devices Mth. IEEE, 1988, vol. 472.

Dekeijser, M. et al., "Atomic Layer Epitaxy of Gallium Arsenide with the Use of Atomic Hydrogen", Appl. Phys. Lett, 1991, vol. 58, pp. 1187.

Dillon, et al., Surface Chemistry of Al2O3 deposition using Al(CH3 and H2O in a binary reaction sequence, Surface Science 322 (1995) 230-242.

Doi, A. et al., "Stepwise Molecular Growth of GaAs by Switched Laser Metalorganic Vapor Phase Epitaxy", Appl. Phys. Lett., 1986, vol. 49, pp. 785.

Dosho, S. et al., "Atomic Layer Epitaxy of ZnSe-ZnTe Strained Layer Superlattices,", J. Crys. Growth,, 1989, vol. 95, pp. 580.

Ducso, C. et al., "Deposition of Tin Oxid into Porous Silicon by Atomic Layer Epitaxy", J. Electrochem. Soc., 1996, vol. 143, pp. 683.

Eds. T. Suntola and M. Simpson, "Atomic Layer Epitaxy", Chapman and Hall, 1990.

Eds. T.F. Kuech, et al., "Atomic Layer Growth and Processing", Mat. Res. Soc. Proc., 1991, pp. 222.

Ehrlich, D.J. et al., "Fast Room-Temperature Growth of SiO2 Films by Molecular-layer Dosing", Appl. Phys. Lett., 1991, vol. 58, pp. 2675.

Elers, K-E. et al., "NbCl5 as a Precursor in Atomic Layer Epitaxy,", Appl. Surf. Sci., 1994, vol. 82/83, pp. 468.

Eres, G. et al., "The Role of Hydride Coverage in Surface-limited Thin-film Growth of Epitaxial Silicon and Germanium", J. Appl. Phys., 1993, vol. 74, pp. 7241.

Fan, J. F. et al., "Low-temperature Growth of Thin Films of Al2O3 with Trimethylaluminum and Hydrogen Peroxide,", Mat. Res. Soc. Symp. Proc., 1991, vol. 222, pp. 327-332.

Fan, J-F. et al., "Low Temperature Growth of Thin Films of Al2O3 by Sequential Surface Chemical Reaction of Trimethylaluminum and H2O2", Jpn. J. Appl. Phys., 1991, vol. 30, pp. L1139.

Faschinger, W. et al., "Observation of Different Reflected High-energy Electron Diffraction Patterns During Atomic Layer Epitaxy Growth of CdTe Epilayers,", J. Cryst. Growth, 1991, vol. 115, pp. 692.

Fujii, K. et al., "Desorption Properties of Amine Species During Atomic Layer Epitaxy of GaAs Using Amino-As,", Appl. Phys. Lett, 1992, vol. 61, pp. 2577.

Fujiwara, H. et al., "Low Temperature Growth of ZnSxSe1-x Alloys Fabricated by Hydrogen Radical Enhanced Chemical Vapor Deposition in an Atomic Layer Epitaxy Mode,", J. Appl. Phys, 1993, vol. 74, pp. 5510.

Genus' Claim Construction Brief Regarding U.S. Patent No. 5,916,365, Case No. C 01-02190 EDL, filed on May 17, 2002.

Genus' Claim Construction Brief Regarding U.S. Patent No. 6,015,590, Case No. C 01-02190 EDL, filed May 17, 2002.

Gong, J.R. et al., "Atomic Layer Epitaxy of AlGaAs,", Appl. Phys. Lett., 1990, vol. 57, pp. 400.

Goodman, C.H.L. et al., "Atomic Layer Epitaxy", J. Appl. Physics, 1986, vol. 60, pp. R65.

Gotoh, J. et al., "Low-temperature Growth of ZnSe-based Pseudomorphic Structures by Hydrogen-radical-enhanced Chemical Vapor Deposition", J. Cryst. Growth, 1992, vol. 117, pp. 85.

Hartmann, J.M. et al., "Atomic Layer Epitaxy of CdTe and MnTe", J. Appl. Phys., 1996, vol. 79, pp. 3035.

Hasunuma, E. et al., "Gas-phase-reaction-controlled Atomic-layer-epitaxy of Silicon", J. Vac. Sci. Technol., 1998, vol. A 16, pp. 679.

Haukka S. et al., "Growth Mechanisms of Mixed Oxides on Alumina", Appl. Surf. Sci., 1997, vol. 112, pp. 23.

Herman, M.A., "Atomic Layer Epitaxy—12 Years Later", Vacuum, vol. 42, 1991.

Herman, M.A. et al., "Surface Morphology of CdTe films Grown on CdTe(111) Substrates by Atomic Layer Epitaxy", J. Cryst. Growth,, 1985, vol. 73, pp. 403.

Higashi, G.S. and Fleming, C.G., Appl. Phys. Lett., 1989, vol. 55, pp. 1963, No. 19.

Hiltunin, L. et al., Materials Chemistry and Physics, 1991, vol. 28, pp. 379.

Hiramatsu, K. et al., "Formation of TiN Films with Low LI Concentration by Pulsed Plasma Chemical Vapor Deposition,", J. Vac. Sci. Techn. A,, vol. 14, pp. 1037-1040, No. 3, 1996.

Horikoshi, Y. et al., "Low-temperature Growth of GaAs and AlAs-GaAs Quantum-well Layers by Modified Molecular Beam Epitaxy,", Jpn. J. Appl. Phys, 1986, vol. 25, pp. L868.

Hunter, A. et al., "A Novel Atmospheric Pressure Technique for the Deposition of ZnS by Atomic Layer Epitaxy Using Dimethylzinc,", J. Cryst. Growth, 1988, vol. 91, pp. 111.

Hyvarinen, J. et al., "Mass Spectrometry Study of ZnS Atomic Layer Epitaxy Process", J. Cryst. Growth, 1988, vol. 86, pp. 695.

Ihanus, J. et al., "ALE Growth of ZnS1-x Sex Thin Films by Substituting Surface Sulfer with Elemental Selenium", Appl. Surf. Sci, 1997, vol. 112, pp. 154.

Imai, S. et al., "A Novel Atomic Layer Method of Silicon", Jpn. J. Appl. Phys, 1991, vol. 30, pp. 3646.

Jensen, K.F. et al., "Proceedings of the Twelfth International Symposium on Chemical Vapor Deposition 1993", Proceedings, 1993, vol. 93-2, Pennington.

Juppo, M. et al., "Deposition of Molybdenum Thin Films by an Alternate Supply of MoCl5 and Zn", J. Vac. Sci. Technol., 1998, vol. A 16, pp. 2845.

Juza, P. et al., "Experimental Test of the Transition Layer Model of Atomic Layer Epitaxy", Appl. Phys. Lett., 1988, vol. 53, pp. 1396.

Kawakyu, Y. et al., "GaAs Atomic Layer Epitaxy Using the KrF Excimer Laser", J. Appl. Phys, 1989, vol. 28, pp. L1439.

Khan, M. Asif et al., "Atomic Layer Epitaxy of GaN Over Sapphire Using Switched Metalorganic Chemical Vapor Deposition", Appl. Phys. Lett., 1992, vol. 60, pp. 1366.

Kimura R. et al., "Atomic Layer Epitaxy of ZnSe on GaAs(1000) by Metalorganic Molecular Beam Epitaxy,", J. Cryst. Growth, 1992, vol. 116, pp. 283.

Koleski, D.D. et al., "Atomic Layer Epitaxy of Si on Ge(100) Using Si2Cl6 and Atomic Hydrogen", Appl. Phys. Lett., 1994, vol. 64, pp. 884.

Koleski, D.D. et al.,, "Atomic Layer Epitaxy of Si on Ge(100): Direct Recoiling Studies of Film Morphology", J. Appl. Phys., 1994, vol. 76, pp. 1615.

Kondon, E. et al., "Interconnection Formation by Doping Chemical-Vapor-Deposition Aluminum with Copper Simultaneously: Al-Cu CVD,", J. Electrochem. Soc., 1994, vol. 141, pp. 3494.

Kong, W. et al., "White Light Emitting SrS:Pr Electroluminescent Devices Fabricated via Atomic Layer Epitaxy", Appl. Phys. Lett., 1995, vol. 66, pp. 419.

Kuech, T.F. et al., "Selective Epitaxy in the Conventional Metalorganic Vapor Phase Epitaxy of GaAs,", Appl. Phys. Ltrs, 1989, vol. 54, pp. 910.

Kukli, K. et al., "Atomic Layer Epitaxy Growth of Tantalum Oxide Thin Films from Ta(OC22H5)5 and H2O", J. Electrochem. Soc., 1995, vol. 142, pp. 1670.

Kukli, K. et al. "Tailoring the Dielectric Properties of HfO2-Ta2O5 Nanolaminates,", Appl. Phys. Lett., 1996, vol. 68, pp. 3737.

Kumagai, H. et al., "Comparative Study of Al2O3 Optical Crystalline Thin Films Grown by Vapor Combinations of Al(CH3)3/N2O and Al(CH3)3/H2O2,", Jpn. J. Appl. Phys., 1993, vol. 32, pp. 6137.

Kurtz, E. et al., "Self-organized CdSe/ZnSe Quantum Dots on a ZnSe (111)A Surface,", J. Cryst., 1998, vol. 184/185.

Lakomaa, E-L. et al., "Surface Reactions in Al2O3 Growth from Trimethylaluminum and Water by Atomic Layer Epitaxy,", Appl. Surf. Sci., 1996, vol. 107, pp. 107.

Lee, C.D. et al., "Growth of ZnSe on (100) GaAs by Atomic Layer Epitaxy", J. Cryst. Growth, 1992, vol. 117, pp. 148.

Lee, J.S. et al., "Self Limiting Growth on Nominally Oriented (111)A GaAs Substrates in Atomic Layer Epitaxy,", Appl. Surf. Sci., 1996, vol. 103, pp. 275.

Leskela, et al., "Atomic Layer Epitaxy in Deposition of Various Oxide and Nitride Thin Films,", Journal De Physique IV, Colloque C5, Supplement au Journal de Physique II, vol. 5, pp. C5-937-C5-951, 1995.

Leskela, M., "Atomic Layer Epitaxy in the Growth of Polycrystalline and Amorphous Films,", 1990, vol. 195, pp. 67.

Leskela, M. et al., Chemtronics, 1988, vol. 3, pp. 113.

Levy, R.A. et al., Low Pressure Chemical Vapor Deposition of Tungsten and Aluminum for VLSI Applications,, J. Electrochem. Soc, 1987, vol. 134, pp. 37C.

Lin, D-S. et al., "Adsorption and Thermal Reactions of Disilane and the Growth of Si Films on Ge(100)-(2x1),", Phys. Rev., 1993, vol. B 47, pp. 6543.

Maa, B.Y. et al., "Surface Reactions in the Atomic Layer Epitaxy of GaAs Using Arsine,", Appl. Phys. Lett., 1991, vol. 58, pp. 1762.

Mahajan, A. et al., "Surface Chemistry of Diethylsilane and Diethylgermane on Si(100): An Atomic Layer Epitaxy Approach,", J. Vac. Sci. Technol., 1994, vol. 12A, pp. 2265.

Martenssoon, P. et al., "Atomic Layer Epitaxy of Copper,", J. Electrochem. Soc., 1998, vol. 145, pp. 2926.

Matsunami, H. et al., "Hetero-interface Control and Atomic Layer Epitaxy of SiC,", Appl. Surf. Sci, 1997, vol. 112, pp. 171.

McDermott, B.T. et al., "Atomic Layer Epitaxy of the Ga-As-In-As Superalloy,", Appl. Phys. Lett, 1987, vol. 51,, pp. 1830.

McMurran, J. et al., "Development of a Low-Temperature GaN Chemical Vapor Deposition Process Based on a Single Molecular Source H2GaN3,", Appl. Phys. Lett., 1999, vol. 74, pp. 883.

Meguro, T. et al., "Effects of Active Hydrogen on Atomic Layer Epitaxy of GaAs,", Appl. Surf. Sci, 1997, vol. 112, pp. 118.

"Corrosion of Aluminum and Aluminum Alloys,", Metals Handbook, 1989, vol. 13, Metals Park.

Mölsä et al., "Deposition of Cerium Dioxide Thin Films on Silicon Substrates by Atomic Layer Epitaxy,", Mat. Res. Soc. Symp., 1994, vol. 325, pp. 341-350.

Morishita, S. et al., "Atomic-layer Chemical-vapor-deposition of Silicon Nitride,", Appl. Surf. Sci., 1997, vol. 112, pp. 198.

Nagel et al.,, "Modified Chemical Vapor Deposition,", Optical Fiber Communications, 1985, vol. 1, Fiber Fabrication, pp. Chapter 1, p. 1-64.

Nakano, M. et al., "Digital Chemical Vapor Deposition of SiO2,", Appl. Phys. Lett., Sep. 10, 1990, vol. 57, pp. 1096-1098, No. 11.

Nelson, J.G., "Summary Abstract: Epitaxial Growth of ZnS and ZnSe on the Low Index Faces of GaAs Using Atomic Layer Epitaxy,", J. Vac. Sci. Technol., 1987, vol. A5,, pp. 2140.

Niinisto, L. et al., "Synthesis of Oxide Thin Films and Overlayers by Atomic Layer Epitaxy for Advanced Applications,", Mater. Sci. Engr., 1996, vol. B41, pp. 23.

Nishi, K. et al., "In situ Optical Characterization of GaAs Surfaces Under Alternating Supply of GaCl and AsH3,", Appl. Phys. Lett, 1992, vol. 61, pp. 31.

Nishizawa, J., "Molecular Layer Epitaxy and Its Fundaments,", J. Cryst. Growth, 1991, vol. 115, pp. 12.

Nishizawa, J. et al., "Doping in Molecular Layer Epitaxy,", Soc., 1989, vol. 136, pp. 478.

Nishizawa, J-I. et al., "Gallium Arsendie Thin Films by Low-temperature Photochemical Processes,", J. Vac. Sci. Technol., 1987, vol. A5, pp. 1572.

Ohno, H. et al., "Atomic Layer Epitaxy of GaAs Using Triethylgallium and Arsine,", Appl. Phys. Lett., 1989, vol. 54, pp. 2000.

Ohtsuka, N. et al., "Extremely High Be Doping of InGaAs by Low Temperature Atomic Layer Epitaxy,", J. Cryst. Growth, 1991, vol. 115, pp. 460.

Ohtsuka, N. et al. "A New GaAs on Si Structure using AlAs Buffer Layers Grown by Atomic Layer Epitaxy,", J. Cryst. Growth, 1990, vol. 99, pp. 346.

Oikkonen, M., "Ellipsometric Studies of Zinc Sulfide Thin Films Grown by Atomic Layer Epitaxy,", J. Appl. Phys., 1987, vol. 62, pp. 1385.

Oikkonen, M. et al., "X-ray Diffraction Study of Microstructure in ZnS Thin Films Grown from Zinc Acetate by Atomic Layer Epitaxy,", Thin solid Films, 1985, vol. 124, pp. 317.

Opening Claim Construction Brief of ASM Regarding the '590 Patent, Case No. C 01 2190 EDL, filed May 3, 2002.

Opening Claim Construction Brief of the ASM Parties Regarding the '365 Patent, Case No. C 01 2190 EDL, filed May 3, 2002.

Ott, A.W. et al., "Surface Chemistry of In2O3 Deposition Using In(CH3)3 and H2O in a Binary Reaction Sequence,", Appl. Surf. Sci., 1997, vol. 112, pp. 205.

Oya, G. et al., "Growth of a-Al2O3 Films by Molecular Layer Epitaxy,", Appl. Phys. Lett., 1987, vol. 51, pp. 1143.

Ozeki, M. et al., "New Approach to the Atomic Layer Epitaxy of GaAs Using a Fast Gas Stream,", Appl. Phys. Lett., 1988, vol. 53, pp. 1509.

Pessa, M. et al., "Atomic Layer Epitaxy of CdTe on the Polar (111)A and (111)B surfaces of CdTe Substrates,", J. Cryst. Growth, 1984, vol. 67, pp. 255.

Piner, E.L. et al., "Effect of Hydrogen on the Indium Incorporation in InGaN Epitaxial Films,", Appl. Phys. Lett., 1997, vol. 70, pp. 461.

Reid, K.G. et al., "Role of Trimethylgallium Exposure Time in Carbon Doping and High Temperature Atomic Layer Epitaxy of GaAs,", Appl. Phys. Lett., 1991, vol. 59, pp. 2397.

Reply Claim Construction Brief of ASM Regarding the '590 Patent, Case No. C 01 2190 EDL, filed May 24, 2002.

Riihela, D. et al., "Introducing Atomic Layer Epitaxy for the Deposition of Optical Thin Films,", Thin Solid Films, 1996, vol. 289, pp. 250.

Ritala, M., "Atomic Layer Epitaxy Growth of TiN Thin Films from TiI4 and NH3,", J. Electrochem. Soc., 1998, vol. 145, pp. 2914.

Ritala, M. et al., "Zirconium Dioxide Thin Films Deposited by ALE Using Zirconium Tetrachloride as Precursor,", Appl. Surf. Sci., 1994, vol. 75, pp. 333.

Ritala, M., et al., Chem. Mater, 1993, vol. 5, pp. 1174.

S. Morishita et al., New Substances for Atomic-layer Deposition of Silicon Dioxide, Journal of Non-Crystalline Solids, 1995, vol. 187, pp. 66-69.

S.M. Bedair, Atomic Layer Epitaxy Deposition Processes, J. Vac. Sci. Technol., vol. B 12 (1), pp. 179-185, 1994.

Sakaue, H. et al., "Digital Chemical Vapor Deposition of SiO2 Using a Repetitive Reaction of triethylsilane/Hydrogen and Oxidation,", Japanese Journal of Applied Physics, 1990, vol. 30, pp. L124-L127, No. 1B.

Sakuma, Y. et al., "Atomic Layer Epitaxy of GaP and Elucidation for Self-limiting Mechanism,", Appl. Phys. Lett., 1990, vol. 56, pp. 827.

Seim, H. et al., "Growth of LaCoO3 Thin Films from bl-diketonate Precursors,", Appl. Surf. Sci, 1997, vol. 112, pp. 243.

Seong, N-J et al., "Ferroelectric SrBi2Ta2O9 Thin Film Deposition at 550° C. by Plasma-enhanced Metalorganic CVD onto a Metalorganic CVD Platinum Bottom Electrode,", J. Vac. Technol, 1999, vol. A17, pp. 83.

Sherman, A., "In situ Removal of Native oxide from Silicon Wafers,", J. Vac. Sci. Technol., vol. B8(4), pp. 656, 1990.

Skarp, J.I. et al., "ALE-reactor for Large Area,", Appl. Surf. Sci, 1997, vol. 112, pp. 251 Depositions.

Sneh, O. et al., Surface Science, 1995, vol. 334, pp. 135.

Soininen, P. et al., "Blue Electroluminescence of SrS:Ce, SiCl4 Thin Films Grown by Atomic Layer Epitaxy,", nt. Display Res. Conf. Proceedings, pp. 511.

Suda, Y. et al., "Thermal and Photostimulated Reactions on Si2H6-adsorbed Si(100)2x1 Surfaces: Mechanisms of Si Film Growth by Atomic Layer Epitaxy,", J. Vac. Sci. Technol., 1989, vol. B7, pp. 1171.

Sugahara, S. et al., "Modeling of Silicon Atomic-layer-epitaxy,", Appl. Surf. Sci, 1996, vol. 107, pp. 161.

Suntola, T., "Atomic Layer Epitaxy,", Thin Solid Films, 1992, vol. 216, pp. 84.

Szczerbakow, A. et al., "Monocrystalline ZnS-sphalerite Films Grown by Atomic Layer Epitaxy in a Gas Flow System,", J. Cryst. Growth, 1998, vol. 183, pp. 708.

Takahashi Y. et al., "Self-limiting Adsorption of SiCl2H2 and its Application to the Layer-by-layer Photochemical Process,", Jpn. J. Appl. Phys, 1991, vol. 30, pp. L-209.

Taki, T. et al., "Atomic Layer Epitaxy of GaAs Using GaBr and GaI Sources,", Appl. Surf. Sci, 1997, vol. 112, pp. 127.

Tammenmaa, M. et al., "Zinc Chalcogenide Thin Films Grown by Atomic Layer Epitaxy Technique Using Zinc Acetate as Source Material,", Thin Solid Films, 1985, vol. 124, pp. 125.

Tammenmaa, M., et al., J. Crystal Growth, 1987, vol. 84, pp. 151.

Tanninen, V.P. et al., "Comparative Study of the Crystal Phase, Crystallite Size and Microstrain in Electroluminescent ZnS:Mn Films Grown by ALE and Electron Beam Evaporation,", Thin Solid Films, 1983, vol. 109, pp. 283.

Tasch, A. et al., "Atomic Layer Epitaxy of Germanium,", J. Vac. Sci. Technol., 1994, vol. 12A, pp. 2265.

"Proceedings of the Second International Atomic Layer Epitaxy Symposium,", Thin Solid Films, 1993, vol. 225, No. 1-2.

Thompson, P.E. et al., "Use of Atomic Layer Epitaxy Buffer for the Growth of InSb on GaAs by Molecular Beam Epitaxy,", J. Appl. Phys, 1991, vol. 69, pp. 7166.

Tischler, M.A. et al., "Self-limiting Mechanism in the Atomic Layer Epitaxy of GaAs,", Appl. Phys. Lett, 1986, vol. 48, pp. 1681.

Tsurumi, T. et al. "Fabrication of Barium Titanate/Strontium Titanate Artificial Superlattice by Atomic Layer Epitaxy,", Jpn. J. Appl. Phys, 1994, vol. 33, pp. 5192.

Usui, A. et al., "GaAs Atomic Layer Epitaxy by Hydride VPE,", Jpan. J. Appl. Phys, 1986, vol. 25, pp. L212.

Usui, A. et al. "Atomic Layer Epitaxy of III-V Compounds by Hydride VPE," Int. Symp. GaAs and related compounds, Int. Phys. conf., 1986, Pages Chapter 3, 129, Ser. No. 83, Las Vegas.

Utriainen, M. et al., "Controlled Electrical Conductivity in SnO2 Thin Films by Oxygen or Hydorcarbon Assisted Atomic Layer Epitaxy,", Electrochem. Soc., 1999, vol. 146, pp. 189.

Watanabe, A. et al., "The Mechanism of Atomic Layer Epitaxy of GaAs Using Trimethylgallium and Arsine,", Vacuum, 1990, vol. 41, pp. 965.

Wisotski, E. et al., "Room-temperature Growth of ZrO2 Thin Films using a novel hyperthermal oxygen-atom source,", J. Vac. Sci. Technol., 1999, vol. A 17, pp. 14.

Yamada, A. et al., "Atomic Layer Deposition of ZnO Transparent Conducting Oxides,", Appl. Surf. Sci, 1997, vol. 112, pp. 216.

Yamaga, S. et al., "Atomic Layer Epitaxy of ZnS by a New Gas Supplying System in Low-pressure Metalorganic Vapor Phase Epitaxy,", J. Cryst. Growth, 1992, vol. 117, pp. 152.

Yamamoto, S. et al., "Atomic Layer-by-layer Epitaxy of Oxide Superconductors by MOCVD,", Appl. Surf. Sci, 1997, vol. 112, pp. 30.

Yao, T. et al., "Growth Process in Atomic Layer Epitaxy of Zn Chalcogenide Single Crystalline Films on (100) GaAs,", Appl. Phys. Lett., 1986, vol. 48, pp. 160.

Yarmoff, Y.A. et al., "Atomic Layer Epitaxy of Silicon by Dichlorosilane Studied with Core Level Spectroscopy,", J. Vac. Sci. Technol., 1992, vol. A 10, pp. 2303.

Yokoyama S. et al., "Atomic Layer Controlled Deposition of Silicon Nitride and an in situ Growth Observation by Infrared Reflection Absorption Spectroscopy,", Appl. Surf. Sci, 1997, vol. 112, pp. 75.

Yokoyama, H. et al., "Atomic Layer Epitaxy of GaAs Using Nitrogen Carrier Gas,", Appl. Phys. Lett., 1991, vol. 59, pp. 2148.

Yu, M.L. et al., "Reaction of Trimethylgallium in the Atomic Layer Epitaxy of GaAs(100),", Appl. Phys. Lett., 1989, vol. 55, pp. 1011.

Yun, S.J. et al., "Dependence of Atomic Layer Deposited Al2O3 Films Characteristics on Growth Temperature and Al Precursors of Al(CH3)3 and AlCl3,", J. Vac. Sci. Technol., 1997, vol. A 15, pp. 2993.

Zhu, Z. et al., "Nitrogen Doping During Atomic Layer Epitaxial Growth of ZnSe,", Appl. Phys. Lett., 1995, vol. 67, pp. 3927.

\* cited by examiner

SEQUENTIAL CHEMICAL VAPOR DEPOSITION

This application is a divisional of U.S. application Ser. No. 10/692,243, filed Oct. 22, 2003, now U.S. Pat. No. 7,410,671 which is a divisional of U.S. application Ser. No. 09/866,156, filed May 24, 2001, now U.S. Pat. No. 6,652,924, which is a divisional of U.S. application Ser. No. 09/291,807, filed Apr. 14, 1999, now U.S. Pat. No. 6,342,277, which is in turn a continuation-in-part of U.S. application Ser. No. 08/699,002, filed on Aug. 16, 1996, now U.S. Pat. No. 5,916,365, each of which is incorporated herein by reference in their entireties. The present invention relates to methods and apparatuses suited to the low temperature deposition of solid thin films of one or more elements by the technique of sequentially exposing the object being coated with chemically reactive gaseous species. It also describes a number of applications of films produced by such processes.

BACKGROUND OF THE INVENTION

CVD Reactor Technology

Chemical vapor deposition (CVD) reactors have been used for decades to deposit solid thin films and typical applications are coating tools, manufacture of integrated circuits, and coating jewelry. A. Sherman, *Chemical Vapor Deposition for Microelectronics*, Noyes Publications, New Jersey, 1987. Up to the 1960's many CVD reactors operated by exposing a heated object or substrate to the steady flow of a chemically reactive gas or gases at either atmospheric or reduced pressures. Since, in general, it has been desired to deposit films at as high a rate as possible as well as at as low a temperature as practical, the gases used to produce the film are extremely reactive (e.g., silane plus oxygen to deposit silicon dioxide). Then if the gases are allowed to mix for too long a time period before impinging the substrate, gas phase reactions can occur, and in extreme cases there can be gas phase nucleation and particles formed rather than deposition of continuous films. At the same time, the high rate of deposition and the reactive gases used makes it very difficult to coat large area substrates uniformly. This results in very complex and expensive commercial CVD reactors. A further complication with this method is that in some cases the films deposited do not conformally coat non-uniform surfaces. This can be particularly deleterious in the manufacture of integrated circuits.

In the 1960's it was realized that we could lower the temperature required for thin film deposition at acceptable rates by creating a low pressure glow discharge in the reactive gas mixture. The glow discharge produces many high energy electrons that partially decompose the reactive gases, and these gas fragments (radicals) are very reactive when they impinge on a surface even at moderate temperatures. Although using a glow discharge allows lower temperature operation, commercial reactors are very complex and expensive, since uniform deposition over large area substrates is even more difficult due to the inherent nonuniformity of glow discharges and due to the added expense of complex high frequency power supplies. Also, this technique can often lead to degradation of the film conformality, due to the highly reactive nature of the radicals.

In the 1970's atomic layer epitaxy (ALE) was developed in Finland by T. Suntola and J. Anston. U.S. Pat. No. 4,058,430 describes how they grew solid thin films on heated objects. This process involves exposing the heated surface to a first evaporated gaseous element, allowing a monolayer of the element to form on the surface, and then removing the excess by evacuating the chamber with a vacuum pump. When a layer of atoms or molecules one atom or molecule thick cover all or part of a surface; it is referred to as a monolayer. Next, a second evaporated gaseous element is introduced into the reactor chamber. The first and second elements combine to produce a solid thin compound monolayer film. Once the compound film has been formed, the excess of the second element is removed by again evacuating the chamber with the vacuum pump. The desired film thickness is built up by repeating the process cycle many (e.g., thousands) times.

An improvement to this technique was described in a later patent issuing in 1983 to T. Suntola, A. Paakala and S. Lindfors, U.S. Pat. No. 4,389,973. Their films were grown from gaseous compounds rather than evaporated elements so the process more closely resembles CVD. This was recognized to be especially advantageous when one component of the desired film is a metal with low vapor pressure, since evaporation of metals is a difficult process to control. With this approach, films were deposited by flow reactors similar to a conventional CVD reactor, where the excess of each gas is removed by flowing a purge gas through the reactor between each exposure cycle. This approach was limited to only a few films, depending on the available gaseous precursors, and all of these films were not as contamination free as desired. We will refer to this process as sequential chemical vapor deposition.

An alternative approach to operating a sequential chemical vapor deposition reactor would be to operate a non-flow vacuum system where the excess gaseous compound of each sequence is removed by vacuum pumps in a manner similar to the original Suntola 1977 process. H. Kumagai, K. Toyoda, M. Matsumoto and M. Obara, *Comparative Study of $Al_2O_3$ Optical Crystalline Thin Films Grown by Vapor Combinations of $Al(CH_3)_3/N_2O$ and $Al(CH_3)_3/H_2O_2$*, Jpn. Appl. Phys. Vol. 32, 6137 (1993).

An early application of sequential chemical vapor deposition was for deposition of polycrystalline ZnS thin films for use in electrochromic flat panel displays. M. Leskela, *Atomic Layer Epitaxy in the Growth of Polycrystalline and Amorphous Films*, Acta Polytechnica Scandinvica, Chapter 195, 1990. Additional studies have shown that other commercially important solid films of different compounds, amorphous and polycrystalline, can be deposited by this technique on large area glass substrates. Among these other films are sulfides (strontium sulfide, calcium sulfide), transition metal nitrides (titanium nitride) and oxides (indium tin oxide, titanium dioxide). Elsewhere, this technique has been developed as a means of depositing epitaxial layers of group III-V (gallium indium phosphide) and group II-VI (zinc selenide) semiconductors, as an alternative to the much more expensive molecular beam epitaxy process.

To applicant's knowledge the only literature discussing sequential chemical vapor deposition of elemental films are those that deposit elemental semiconductors in group IVB such as silicon and germanium. One such study, S. M. Bedair, *Atomic Layer Epitaxy Deposition Process*, J. Vac. Sci. Technol. B 12 (1), 179 (1994) describes the deposition of silicon from dichlorosilane and atomic hydrogen produced by a hot tungsten filament. By operating the process at 650° C. deposition of epitaxial films are described. Deposition of diamond, tin and lead films, in addition to silicon and germanium by an extraction/exchange method in conjunction with a sequential processing scheme similar to sequential chemical vapor deposition has also been reported M. Yoder, U.S. Pat. No. 5,225,366. Also although some of the studies reported have explored processes that may be useful at moderate temperatures, most require undesirably high substrate temperatures (300-600° C.) to achieve the desired sequential chemical vapor deposition growth of high quality films.

Conformal Films Deposited at Low Temperatures for Integrated Circuit Manufacture A continuing problem in the commercial manufacture of integrated circuits is the achievement of conformal deposition of dielectric (e.g., silicon dioxide, silicon nitride) or conducting (e.g., aluminum, titanium nitride) thin solid films over large area wafers (e.g., 12 inches in diameter). A film is conformal when it exactly replicates the shape of the surface it is being deposited on.

In one paper by D. J. Ehrlich and J. Melngailis, *Fast Room-Temperature Growth of $SiO_2$ Films by Molecular-layer Dosing*, Appl. Phys. Lett. 58, 2675 (1991) an attempt was reported of layer by layer deposition of silicon dioxide from silicon tetrachloride and water. Although the films appear to be very conformal, there is no discussion of film quality or density, and it is likely that these films are porous making them unsuitable for thin film applications. In support of this conclusion, we can refer to a study by J. F. Fan, K. Sugioka and K. Toyoda, *Low-Temperature Growth of Thin Films of $Al_2O_3$ with Trimethylaluminum and Hydrogen Peroxide*, Mat. Res. Soc. Symp. Proc. 222, 327 (1991). Here, aluminum oxide deposited at 150° C. was compared to deposition at room temperature. In this case, the room temperature films thickness reduced from 2270 Å to 1200 Å upon annealing at 150° C. for 15 minutes confirming the high porosity of the film deposited at room temperature. Another attempt to deposit silicon dioxide by sequential chemical vapor deposition used silane and oxygen by M. Nakano, H. Sakaue, H. Kawamoto, A. Nagata and M. Hirose, *Digital Chemical Vapor Deposition of $SiO_2$*, Appl. Phys. Lett. 57, 1096 (1990). Although these films, deposited at 300° C., appeared to be of better quality, they were not perfectly conformal, and could only fill holes of an aspect ratio up to 3:1. Modern integrated circuit technology requires the ability to coat holes and trenches with aspect ratios well in excess of 3:1.

Another technologically important thin solid film that needs to be deposited with high purity and at low temperature, conformally over large area wafers, is the multilayer film of titanium and/or titanium silicide plus titanium nitride. Here, the need is for a thin titanium and/or titanium silicide layer to be deposited on a silicon contact (100 Å) followed by a layer of titanium nitride (3-400 Å). In a recent paper by K. Hiramatsu, H. Ohnishi, T. Takahama and K. Yamanishi, *Formation of TIN Films with Low Cl Concentration by Pulsed Plasma Chemical Vapor Deposition*, J. Vac. Sci. Techn. A14 (3), 1037 (1996), the authors show that an alternating sequence process can deposit titanium nitride films at 200° C. from titanium tetrachloride and hydrogen and nitrogen. However, the chlorine content of the films was 1%, and no attempt was made to deposit pure titanium metal or titanium silicide. Also, the reactor used was very similar to the conventional expensive plasma enhanced CVD reactor.

Finally, sputtered aluminum films have been widely used to fabricate integrated circuits for many years. Unfortunately, sputtering is a line of sight deposition technique, so the films tend to be non-conformal. This has become more of a problem, in recent years, as denser circuit designs have resulted in holes of high aspect ratio that need to be filled. For this reason, many attempts have been made to find a suitable chemical vapor deposition process that would be highly conformal, and several processes have been successfully demonstrated by R. A. Levy and M. L. Green, *Low Pressure Chemical Vapor Deposition of Tungsten and Aluminum for VLSI Applications*, J. Electrochem. Soc. Vol. 134, 37C (1987). Although conformal thin films of aluminum can be deposited by CVD, these films are still not acceptable for use in circuits, because aluminum is susceptible to electromigration and it is preferred to add several percent of copper to these films to avoid this problem. All but one attempt to carry out the CVD process with copper precursors added to the aluminum precursors have been unsuccessful. See E. Kondoh, Y. Kawano, N. Takeyasu and T. Ohta, *Interconnection Formation by Doping Chemical-Vapor-Deposition Aluminum with Copper Simultaneously: Al—Cu CVD*, J. Electrochem. Soc. Vol. 141, 3494 (1994). The problem is that although there are CVD processes for the deposition of copper, the precursors used interact with the aluminum precursors in the gas phase preventing the simultaneous deposition of aluminum and copper.

Composite Fabrication

Many schemes have been developed to fabricate composite materials, because of the unusual strength of such materials. One approach to the fabrication of such materials is to prepare a cloth preform (e.g. from threads prepared from carbon fibers), and then expose this preform to a hydrocarbon gas at high temperatures. The hydrocarbon then pyrolyses with carbon depositing on the carbon preform. Unfortunately, this process is not very conformal, so that the outer pores of the preform are sealed before the interior can be coated, and the process has to be stopped prematurely. The preform then has to be machined to remove the outer layer, and further exposure is needed. This is a slow and very expensive process which is referred to in the literature as Chemical Vapor Infiltration (CVI); see e.g., *Proceedings of the Twelfth International Symposium on Chemical Vapor Deposition* 1993, eds. K F. Jensen and G. W. Cullen, Proceedings Vol. 93-2, The Electrochemical Society, Pennington, N.J.

Coating Aluminum with Aluminum Oxide

As is well known, coating aluminum with a thin layer of oxide is an excellent way to protect this material from corrosion by the elements. The traditional way of doing this is to anodize the aluminum with a wet electrochemical process (*Corrosion of Aluminum and Aluminum Alloys*, Vol. 13 of Metals Handbook, ASM, Metals Park, Ohio, 1989). Pinholes and other defects in the anodized layer are the source of local failure of the corrosion protection of the anodized layer. Such pinholes occur because the wet anodization process relies on the underlying aluminum as the source of the aluminum in the aluminum oxide coating, and the underlying aluminum can have many impurities and defects. A preferred approach would be to deposit the desired aluminum oxide from an external source. Although using a CVD process to carry this out is a possible choice, this has not been explored because the traditional CVD process operates at 1000° C., and this far exceeds the melting point of the underlying aluminum.

Low Temperature Brazing

In the manufacture of high temperature, high density ceramics, there is great difficulty in fabricating unusual shapes to high accuracy. Most often the ceramic is formed in the "green" state, machined while still soft, and then fired at high temperature. After firing, the resulting high density ceramic part may require additional machining, for example, with diamond grinding wheels, to achieve the desired dimensional accuracy. In some cases, the part shape makes this additional machining difficult and expensive, and in some instances there may be no known way to reach the surface that needs to be ground. High temperature brazing of ceramic parts is an alternate technology for joining odd shapes of accurately finished ceramics. In some instances the braze metal may not be compatible with the desired application. Also the high temperature preferred for metal brazing makes it difficult to join parts of different thermal expansion coefficients. For example, it is not possible to braze aluminum to alumina ceramic, because the traditional brazing temperature would be far higher than the melting point of the aluminum.

SUMMARY OF THE INVENTION

In one embodiment, the present invention provides a reactor operated at low pressure, a pump to remove excess reactants, and a line to introduce gas into the reactor through a valve. In this embodiment, a first reactant forms a monolayer on the part to be coated, while the second reactant passes through a radical generator which partially decomposes or activates the second reactant into a gaseous radical before it impinges on the monolayer. This second reactant does not necessarily form a monolayer but is available to react with the monolayer. A pump removes the excess second reactant and reaction products completing the process cycle. The process cycle can be repeated to grow the desired thickness of film.

Because the film can be deposited one monolayer at a time, the film forming on the part tends to be conformal and have uniform thickness. The present invention may use inexpensive reactors that can coat many parts simultaneously reducing costs. For the formation of a three-element film, an additional step introduces a third reactant in the process cycle. A stable compound film of any number of elements can be formed by growing the monolayers of the elements with gaseous precursors that contain the elements. Such precursors can be halides or organometallic compounds.

It is an object of the invention to facilitate the growth of thin films of any element by using a radical generator to make available highly reactive gases (radicals).

DETAILED DESCRIPTION OF THE PREFERRED EMBODIMENTS

Figure 1:
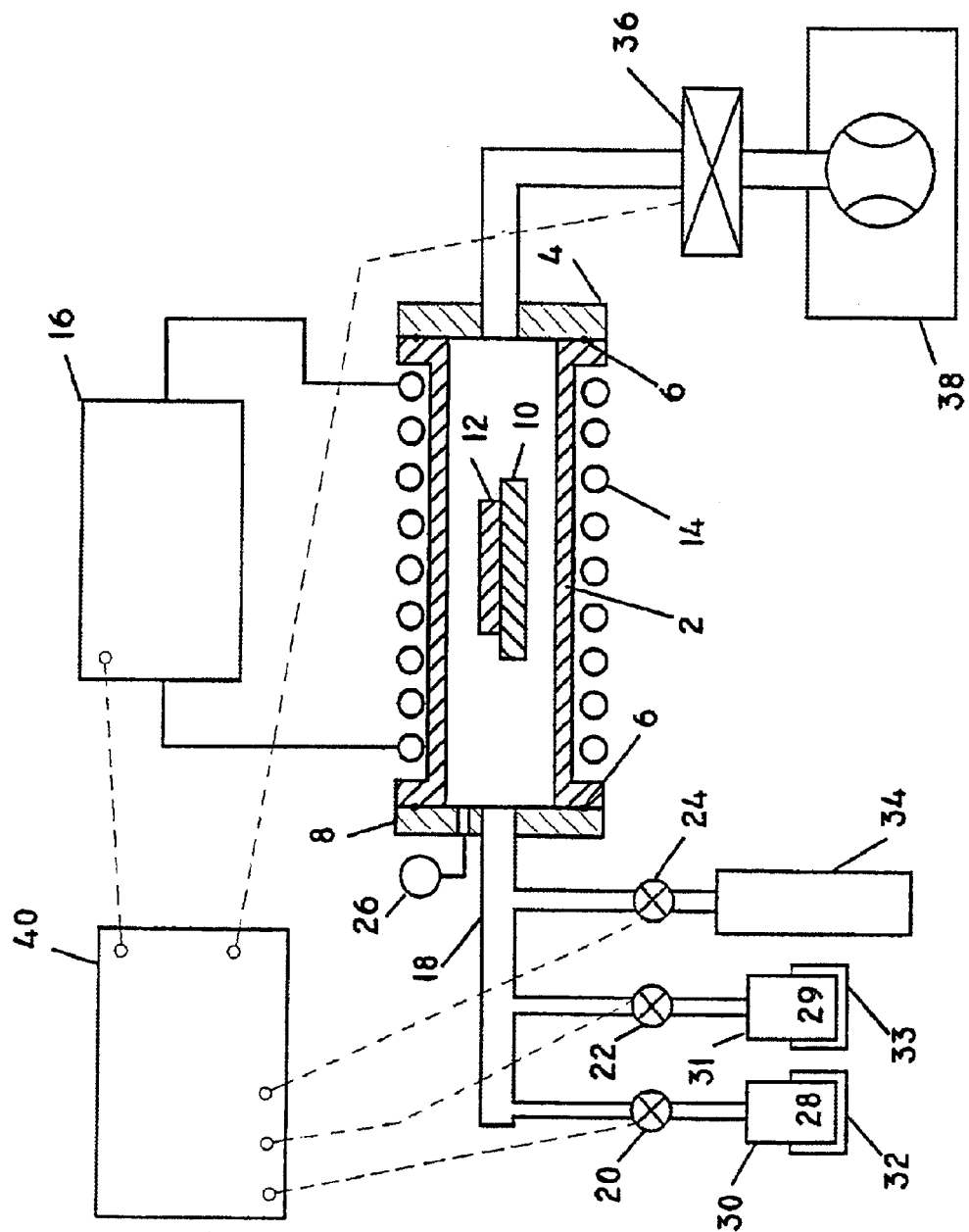
FIG. 1 is a schematic drawing of a sequential CVD reactor, suitable for the deposition of films that are not electrically conducting, constructed in accordance with one embodiment of the present invention.

FIG. 1 is a cross-section view of a reactor vessel 2 made of a non-conducting dielectric ceramic (e.g. a quartz cylinder) which is suitable for the deposition of a non-electrically conducting film on a non-electrically conducting part. The reactor vessel 2 forms a chamber closed at one end by a flange 8, through which gases are introduced, and closed at the other end by a flange 4 which connects to a vacuum pump 38 through a pneumatically operated solenoid gate valve 36. Each flange has an O-ring seal 6 to allow vacuum operation. The part 12 is placed in the reactor vessel 2 on a non-electrically conducting part holder 10. A vacuum gage 26 monitors the chamber pressure during operation. A first reactant 28 is introduced as a gas into the chamber by evaporating a liquid or solid contained in bottle 30 by temperature controller 32 to provide adequate vapor pressure for delivery into the chamber. In many situations, the temperature controller 32 will provide heat to the first reactant in the bottle 30. However, in others the controller may cool the first reactant 28 in the bottle 30.

The first reactant 28 will be a compound having the elements of the monolayer to be formed on the part 12 such as the first reactants listed below in Examples 1-7. The first reactant 28 is introduced into the reactor vessel 2 through solenoid operated pneumatic valve 20 by a manifold 18. FIG. 1 illustrates a system with two bottles 30 and 31, each containing a first reactant 28 and 29, however, the type of film to be formed will determine the number of reactants and bottles. For example, if a ternary film is desired, the system will include three bottles and three valves. A conventional digital microcontroller 40 sequences the opening and closing of the valves 20 and 22 to deliver the first reactants to the chamber at the appropriate times as illustrated in FIG. 2.

Referring to FIG. 1, during a typical operation, a monolayer of the first reactant is deposited on the part 12 to be coated by exposure to the first reactant 28 in vapor phase from the bottle 30. This monolayer is reacted by exposing it to a flux of radicals generated by the action of a solenoidal coil 14, excited by a RF power supply 16, on molecules introduced from a gas bottle 34. The RF power supply 16 can be controlled by the microcontroller circuit 40.

Figure 2:
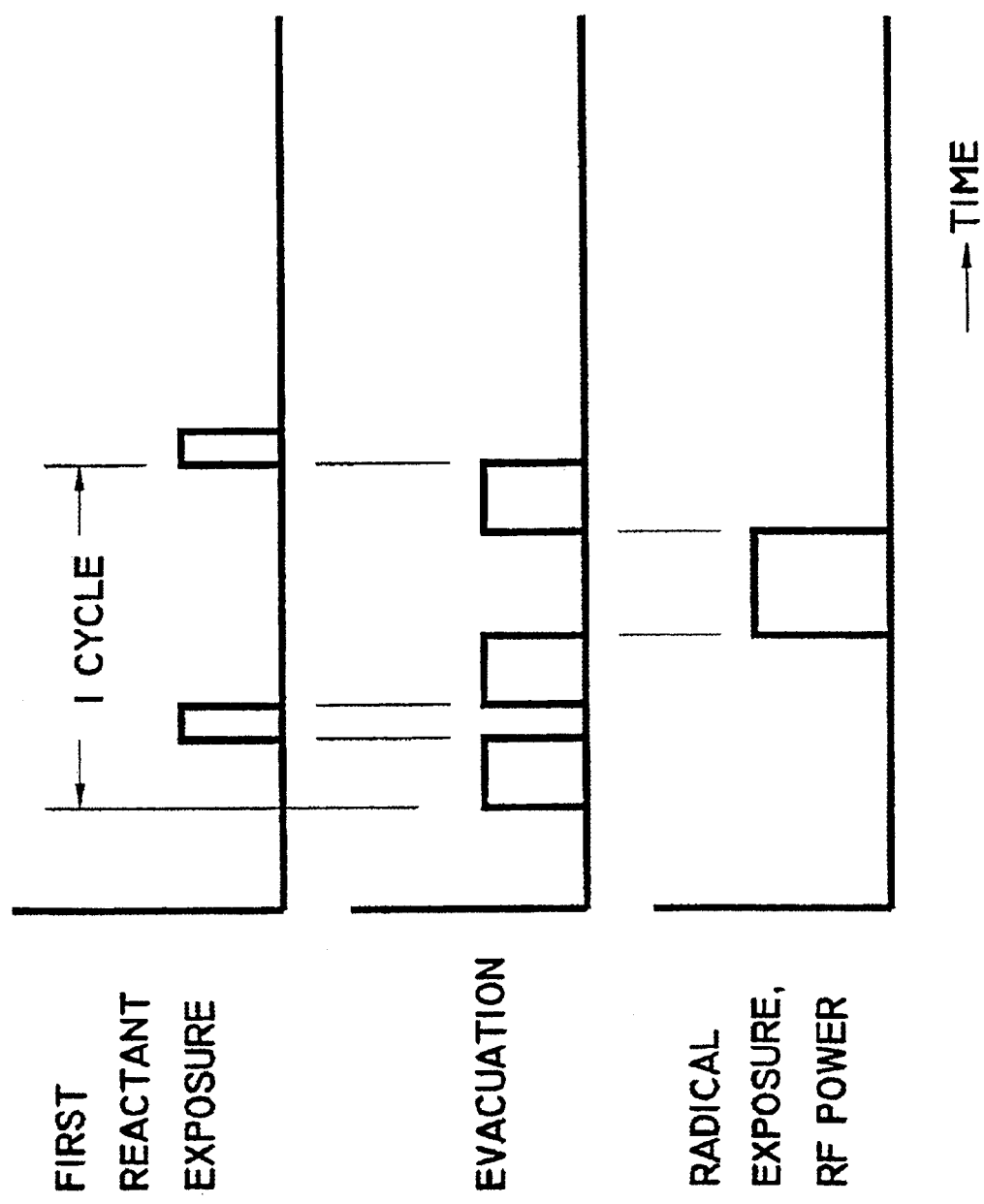
FIG. 2 illustrates a process cycle for the sequential CVD process.

FIG. 2 illustrates a process cycle for forming thin films with reactor vessel shown in FIG. 1. Initially, the vacuum pump 38 evacuates the chamber of the reactor vessel 2. The exhaust gate valve 36 then closes and a valve 20 opens for a short period of time to deliver the first reactant 28 to the reactor vessel 2 in a sufficient amount to form a monolayer of molecules on the part 12 to be coated. After the monolayer is formed, the reactor vessel 2 is again evacuated by the vacuum pump 38 to remove excess first reactant. Next, a second reactant from bottle 34 is delivered into the reactor vessel 2 for a short period of time while a solenoidal coil 14 is excited by the RF power supply 16 generating radicals. This step is carried out for a sufficient period of time to fully react the radicals with the first reactant monolayer. Finally, the reactor vessel 2 is evacuated again by the vacuum pump 38 ending the first cycle. The process cycle can then repeat to form the desired thickness of the film.

Figure 3:
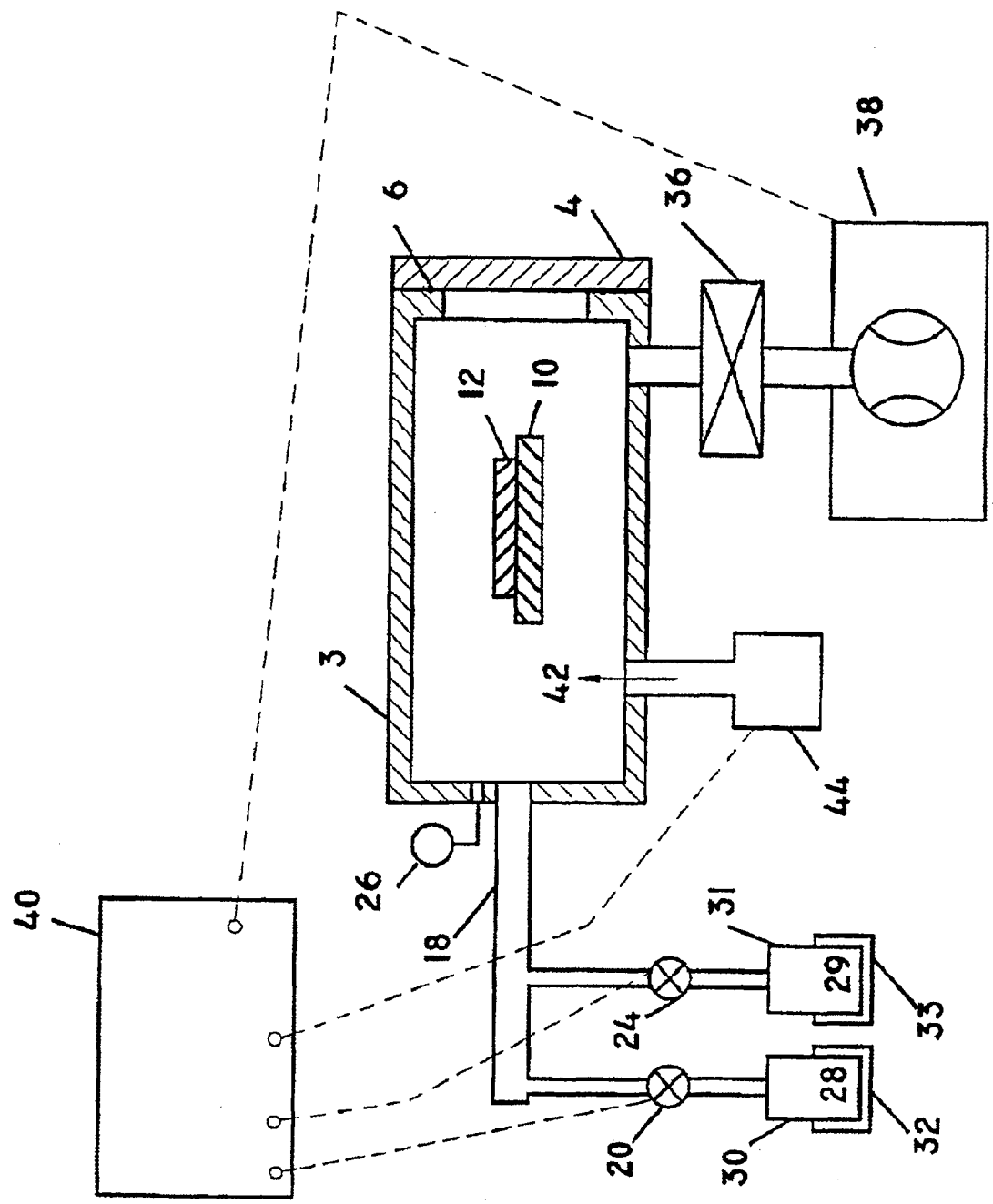
FIG. 3 is a schematic drawing of a sequential CVD reactor, suitable for the deposition of any film, conducting or non-conducting, constructed in accordance with an embodiment of the present invention.

If the film to be deposited is electrically conducting, reactor vessel 2 will be coated by a conducting film which eventually shields out the exciting electric field provided by the solenoidal coil 14. To avoid unnecessary reactor vessel cleaning, in another embodiment, the present invention provides the reactor vessel 3 as shown in FIG. 3. The exhaust flange 4 provides access to the interior of the reactor vessel 3. The flow of second reactant 42 is generated in a radical generator 44 which is attached to the wall of the reactor vessel 3. As before the first reactant 28 is provided from the bottle 30 and introduced to the reactor vessel 3 through the valve 20 and the manifold 18. In this embodiment, the part holder 10 can be either a metal or a ceramic. Again the microcontroller 40 controls all valves and the radical generator 44.

The radical generator 44, suitable for use with the reactor vessel 3, shown in FIG. 3, can take on many well known arrangements. One arrangement is to use a miniaturized version of the quartz tube 2 and RF coil 14 described in FIG. 1. In this arrangement, the only modification is to provide an end plate with a small hole in it, so that the radicals can flow rapidly into the reactor vessel 3 through such a nozzle. One illustration of a suitable end plate with a hole in it serving as a nozzle is shown in FIG. 1, as a stainless steel anode, in a paper by A. Sherman, *In situ Removal of Native Oxide from Silicon Wafers*, J. Vac, Sci. Technol. Vol. B8 (4), 656 (July/August 1990) which paper is incorporated by reference here in its entirety. This paper also describes generating hydrogen radicals using a hollow cathode DC discharge chamber. Other alternatives are reviewed for hydrogen radical generation in a recent paper by V. M. Beramudez, *Simple, Efficient Technique for Exposing Surfaces to Hydrogen Atoms*, J. Vac. Sci. Technol. Vol. A14, 2671 (1996). Similar techniques can be also used to generate any of the radicals that might be needed to form the elemental films described herein.

Concerns about the uniformity of distribution of radicals should not control the type of radical generator 44 to be employed. As long as sufficient radicals are generated to react the first reactant, any excess radicals play no role in the film formation. More important considerations relate to avoiding the introduction of contaminants, the cost of the radical generator, and simplicity of its operation. Also, the reaction between any one of the first reactants adsorbed on the part surface and the radical flux to the part, should be rapid and independent of surface temperature. Therefore, it should be possible to carry out these thin film depositions at lower temperatures than in conventional sequential chemical vapor deposition processes which are typically carried out at 300-600° C.

One of the difficulties in the commercial application of traditional sequential chemical vapor deposition processes, is that they deposit films slowly. For very thin films (e.g. 100 Å) this is of little concern. However, if thicker films are required (e.g., 1 µm or 10,000 Å), then the commercial viability of some applications may be in question.

In the present process, by virtue of the use of remotely generated, very reactive, radicals (e.g. oxygen atoms, hydrogen atoms, nitrogen atoms, etc.) we are able to operate the process at room temperature. This fact gives rise to two features of this process that can lead to higher throughput from the reactor used.

When the first reactant is exposed to the substrate at room temperature, it is possible for more than one monolayer to remain behind after the reactor is evacuated with a vacuum pump. In fact, if the substrate temperature is lowered enough we would find the precursor condensing to a liquid film on the substrate surface—obviously not the way to operate the present process. Then when the substrate, with multiple monolayers remaining on its surface, is exposed to the second reactant (radical) more than one monolayer of product film can be grown in each cycle. Our experimental data has verified that 3 Å of $Al_2O_3$ grows per cycle from TMA and oxygen atoms at room temperature. All other studies of $Al_2O_3$ formed in thermal (e.g. high temperature) sequential CVD shows deposition rates of less than 1 Å/cycle.

Second, if we do not have to fully evacuate the reactor chamber after each precursor exposure in our process, we could shorten the time for each cycle. In the flow type reactor described by Suntola in U.S. Pat. No. 4,389,973, he used an inert gas to purge each reactant after each exposure of the substrate. Typically nitrogen gas was used as the purge gas. In our case, the second reactant is created by striking a glow discharge in an otherwise inert gas (e.g. $O_2 \rightarrow O$). Therefore, there is no need to use a separate inert gas to purge the first reactant. We can simply use the second gas with the discharge turned off. Again, it is not necessary to purge the second reactant, because it goes away when we extinguish the glow discharge. By eliminating the separate purge gas, we can shorten and simplify the deposition cycle. This will enable a shortening of the cycle time.

It should be recognized, however, that there are some instances where using a purge gas to separate the two reactants in a sequential CVD reactor may not be the most desirable way to operate the system. When substrates are being coated that have features with high aspect ratio holes or trenches it will, in general, be more effective to use the vacuum pump out style described earlier. This will be the case, because it would be harder for a given reactant to diffuse through an inert gas down to the bottom of a hole when the hole is filled with inert gas. For those applications where high aspect ratio holes do not have to be coated (e.g., large area flat panel displays), then the inert gas purge would be suitable. In that case, using the gas in which a glow discharge is created as the inert gas (with glow discharge off) for a purge operation should enhance throughput.

Finally, when very thin films of dielectric materials (e.g., $Al_2O_3$, $TiO_2$, $Si_3N_4$) are deposited by a sequential CVD process, the surface may have a substantial degree of roughness in spite of the layer by layer method of deposition. Apparently, this phenomenon is caused by some poorly understood agglomeration process as the film is growing. One technique that can be used to avoid this surface roughening would be to grow many thin layers where two similar materials alternate. For example, if we want a 100 Å film we could grow, alternately, 10 Å layers of $Al_2O_3$ and 10 Å layers of $Si_3N_4$ and do it 5 times. This should produce a dielectric layer with a dielectric constant of about 7-8, which is a good diffusion barrier and has good electrical breakdown strength, and which is also very flat. By using the new method described earlier, we can deposit such a flat multi-layer film at lower temperatures than were possible before.

EXAMPLE 1

Deposition of thin films of silicon dioxide can be carried out with a silicon precursor, such as dichlorosilane which can be reduced to elemental silicon by a flux of hydrogen atoms. S. M. Bedair, *Atomic Layer Epitaxy Deposition Process*, J. Vac. Sci. Technol. B 12 (1), 179 (1994). It should also be possible to deposit elemental silicon from other precursors (e.g., silane, tetramethylsilane) and atomic hydrogen. The resulting silicon can then be converted to silicon dioxide by exposure to oxygen. In this way a silicon dioxide film can be grown monolayer by monolayer. Another way to grow this film would be to use a silicon precursor that already contains oxygen. For example, one could use tetraethoxysilane and reduce it with oxygen atoms.

EXAMPLE 2

In one embodiment, the present invention provides a process for coating a part with an elemental metal film. For brevity sake, we will limit the discussion to a titanium metal film. In this example, the first reactant could be titanium tetrachloride which could be introduced into the reactor at a low pressure so that a monolayer adsorbs to the surface of the part. Next, any excess titanium tetrachloride in the reactor chamber is pumped out. In order to form pure titanium films, we could then expose the surface to low pressure hydrogen in atomic form. The hydrogen atoms will react with the chlorine in the titanium tetrachloride monolayer to form HCl. The HCl vapor can then be exhausted by a vacuum pump, and a monolayer of titanium will be left behind. The thickness of the titanium metal film is determined simply by the number of process cycles carried out. By this process it is possible to grow a film of any element that is solid at room temperature.

Deposition of thin titanium plus titanium nitride compound films could be derived from titanium tetrachloride and hydrogen atoms to yield the pure titanium, followed by exposure to nitrogen atoms to form the nitride. Alternately, we could expose titanium tetrachloride to NH radicals to produce titanium nitride films directly. Again, if we use a precursor that contains both titanium and nitrogen atoms, e.g., tetrakis(diethylamino)titanium or tetrakis(dimethylamino)titanium, we could reduce a monolayer of either of these species with hydrogen atoms or HN radicals to form titanium nitride.

EXAMPLE 3

The present invention provides for growing a film with three or more elements such as an oxynitrides by sequentially growing an oxide and then growing a nitride. In fact, there would be no difficulty in growing ternary compounds such as tantalum/silicon/nitrogen which is a good diffusion barrier film for advanced integrated circuits.

Various binary and ternary silicides can be formed by depositing one, or more, metallic or semiconductor elements and nitriding the layer with nitrogen atoms. For example, we could deposit a monolayer of pure silicon, and then a monolayer of pure titanium. If the resulting monolayer of titanium silicide were then nitrided with a flux of nitrogen atoms, we could have a titanium/silicon/nitrogen ternary compound. Also, the stoichiometry of the compound film could be changed simply by changing the number of cycles used for any of the elements. For example, titanium disilicide ($TiSi_2$) could be formed from two silicon cycles for each titanium cycle.

EXAMPLE 4

Deposition of aluminum films doped with copper and silicon could be formed from triisobutylaluminum, copper(II) acetylacetonate[$Cu(acac)_2$], and tetramethylsilane each reduced in turn by hydrogen atoms. The percentages of copper and/or silicon dopants could be adjusted by controlling how many layers of each element are deposited. For example, a two percent doping level of copper is achieved by depositing one layer of copper for every 50 layers of aluminum.

EXAMPLE 5

If we take full advantage of the ability of the sequential CVD process to conformally coat parts that are very porous, we could fabricate a number of important composite materials. For example, we could grow a carbon layer from methane and hydrogen atoms. This layer could then be converted to a silicon carbide by growing a silicon layer as described in Example 1. This silicon carbide coating could be used to coat a carbon fiber preform until a solid silicon carbide body is formed reinforced with carbon fibers. The carbon fibers would give the part great strength, and the silicon carbide would allow it to be used at high temperatures in air. Ceramic composites using alumina whiskers could be formed by growing aluminum oxide on a preform made from such fibers. Metallic composites could be also prepared using metallic fiber preforms and a sequential CVD to grow metal on the preform.

EXAMPLE 6

We now know that good quality aluminum oxide thin films can be grown at moderate temperatures by H. Kumagai, K. Toyoda, M. Matsumoto and M. Obara, *Comparative Study of $Al_2O_3$ Optical Crystalline Thin Films Grown by Vapor Combinations of $Al(CH_3)_3/N_2O$ and $Al(CH_3)_3/H_2O_2$*, Jpn. J. Appl. Phys. 32 6137 (1993) by sequential CVD. It is, therefore, possible to coat anodized aluminum parts with this highly conformal layer. The earlier CVD processes could not be used because they had to be operated at temperatures higher than the melting point of aluminum. One approach would be to use known methods of sequential CVD to coat aluminum. An alternative approach would be to take advantage of the process described in the present invention, where we can form monolayers of pure aluminum and then oxidize these layers with oxygen atoms. For example, we could reduce trimethylaluminum with hydrogen atoms to form the aluminum layer. This layer will readily oxidize when exposed to oxygen. If the aluminum were initially anodized, the sequential chemical vapor deposition film will fill in any defects or pinholes.

EXAMPLE 7

Joining two pieces of ceramic at low temperature with a pure ceramic material, is a process that has some unique advantages. For example, the temperature tolerance of the joined parts will be as high as the original ceramic parts. Also, no new material is added to the structure, so the resulting joined part is of high purity, and just as chemically inert as the original ceramics. Such a process does not exist today. For example, two pieces of aluminum oxide could be joined by growing aluminum oxide, as described in Example 6, on the two adjacent parts.

EXAMPLE 8

The capacitance of a capacitor is directly proportional to the dielectric constant of the dielectric material between the capacitor plates. It is also inversely proportional to the dielectric thickness. When it is desired to increase the capacitance in an integrated circuit, it is traditional to reduce the thickness of the preferred dielectric thermal $SiO_2$. In modern advanced circuits, the practical limit to $SiO_2$ thickness has been reached (~30 Å). Attempts to grow uniform pinhole free $SiO_2$ films thinner than this has proven difficult. An alternative would be to deposit a dielectric with a higher dielectric constant, and this would allow a more practical dielectric thickness. For example, if we deposit a thin film of $Ta_2O_5$, with a dielectric constant of 25 (6× that of silicon dioxide), then the 30 Å film could be 180 Å thick. Not only is this a film thickness that can be reliably deposited, further improvements in capacitance can be achieved by reducing the thickness of the $Ta_2O_5$ further.

Unfortunately, very thin layers of $Ta_2O_5$ deposited on silicon by traditional CVD high temperature techniques, result in dielectrics with a dielectric constant of much less than 25. This is because as the process is begun, the first thing that happens is that the silicon oxidizes and we end up with a composite layer of $Ta_2O_5$ and $SiO_2$. The much lower dielectric constant of the $SiO_2$ lowers the overall value of the dielectric constant of the composite film.

In the current process, we can deposit $Ta_2O_5$ at low temperatures, if desired, and thereby minimize any oxidation of the underlying silicon. If, regardless of the low temperatures used, we find that there is still some silicon oxidation, we can deposit one or several monolayers of some oxygen barrier material (e.g. TiN, TaN, etc.) or sacrificial material (e.g. Ta) on the silicon before proceeding to the $Ta_2O_5$ deposition using oxygen atom radicals.

EXAMPLE 9

In recent years there has been a tendency to replace the aluminum conductors, in an integrated circuit, with copper conductors. Since it is very difficult to plasma etch copper in the same way that aluminum is etched, most manufacturers have gone to a "Damascene" or inlaid approach. The traditional technique would be to deposit a layer of copper, etch holes in this copper layer, and then fill these holes with a suitable dielectric. Instead, we deposit a layer of dielectric material, etch holes in it, and then coat the entire surface with a layer of copper. This copper fills all the holes previously etched. Then the excess copper on the wafer surface is removed with a chemical mechanical polishing step. Of the several ways that copper can be deposited, the preferred appears to be electroless plating. Unfortunately, copper cannot be electroplated onto insulator surfaces, so a copper "seed" layer is deposited by CVD. If the conformal coverage of this "seed" layer is good, then the full copper layer can be reliably coated.

Recent efforts to deposit pure copper thin films by CVD have required the use of complex and expensive copper organometallic compounds. This approach has been found to be preferred because all available copper halogen compounds, which are inexpensive, are high temperature melting point solids, and they are difficult to vaporize in a controlled fashion for introduction into the CVD reactor chamber.

With the flexibility of the present process described earlier, we can use an inexpensive copper-oxygen organometallic compound (e.g., Copper II 2,4-pentanedionate $C_{10}H_{14}O_4Cu$ which is stable, has a vapor pressure of 10 mtorr at 100° C., and is inexpensive) and reduce it to $CuO_2$ with exposure to oxygen atoms. Then, in a second step the monolayer of $CuO_2$ could be reduced to elemental copper by exposure to hydrogen atoms. Repeating this process for many cycles could produce pure copper thin films of any desired thickness. At the same time, if a diffusion barrier layer is needed between the copper and the underlying Si and $SiO_2$, such as TiN, then both layers could be deposited in the same system sequentially. This could simplify the manufacturing process considerably.

EXAMPLE 10

When depositing a monolayer of some element or compound into a very high aspect ratio blind hole (e.g., 10:1), we first evacuate all gaseous species from the hole. Next we expose the hole to precursor molecules that adsorb onto the hole surface as well as fill the hole volume. Then the precursor molecules occupying the interior hole volume are removed by pumping with a vacuum pump. The next step in the process is to expose the adsorbed monolayer to a radical flux which then converts it into the desired monolayer of solid molecular species.

In those cases of extremely high aspect ratio blind holes, another phenomena has to be recognized. When the radical flux diffuses into the evacuated volume of the hole, surface reactions release reaction products. For example, when adsorbed TMA molecules are attacked by oxygen atoms a monolayer of $Al_2O_3$ is formed and reaction products such as $H_2O$, $CO_2$, and CO are formed. If the hole is very long and narrow, then it is possible that these reaction product molecules could impede the diffusion of radicals into the bottom of the blind hole, unless the exposure to radicals was maintained for an impracticably long time.

Figure 4:
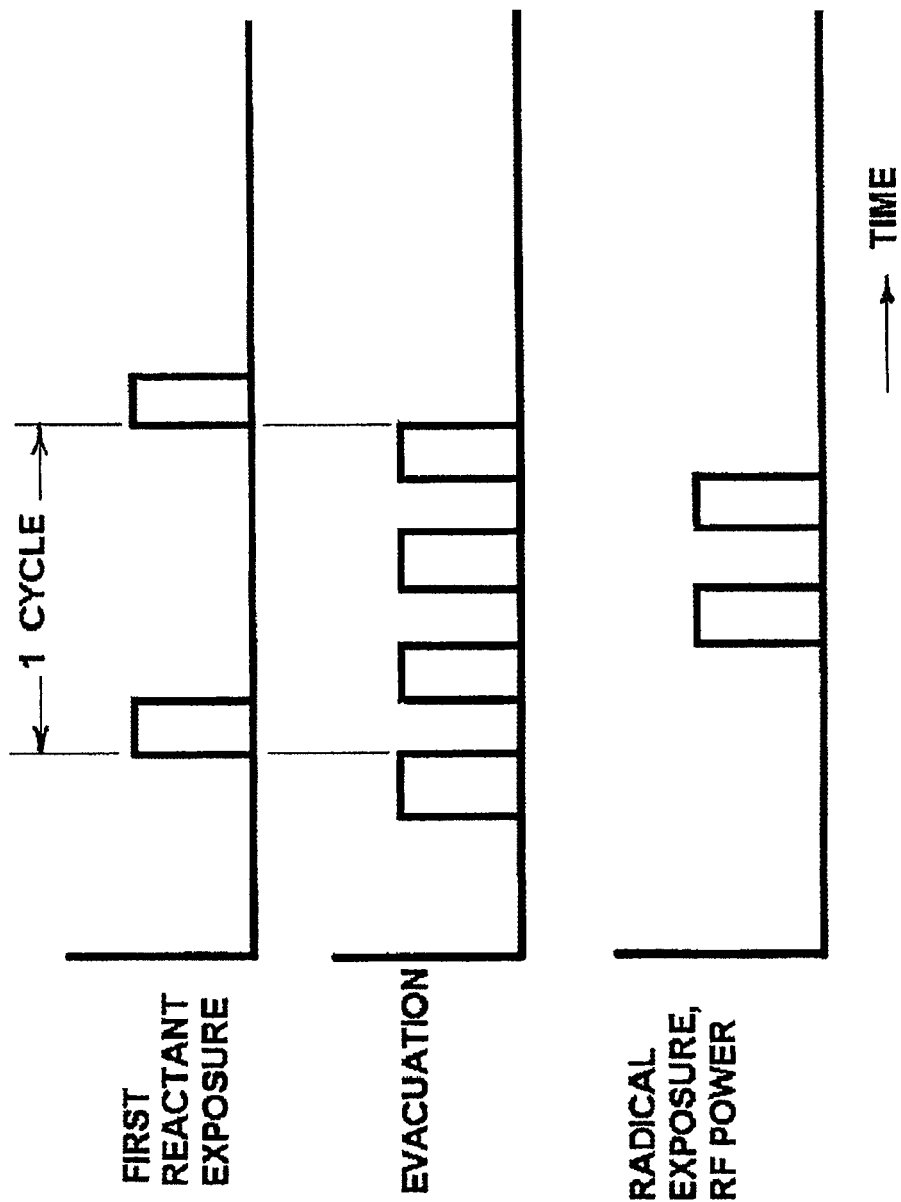
FIG. 4 illustrates an alternative process cycle for the sequential CVD process.

The solution to this practical difficulty is to expose the very long blind holes to the radical flux in a cyclical fashion, as illustrated in FIG. 4. In other words, after a short exposure of the precursor monolayer to the radicals, evacuate the chamber with a vacuum pump. This will have the effect of removing any gaseous reaction products that might tend to prevent radical diffusion into the hole. Then a second exposure to the radical flux is performed. If preferred, this process can be repeated many times to achieve the preferred reactions at the end of the very long and narrow blind hole.

EXAMPLE 11

When depositing metallic films, by sequential CVD, onto surfaces that may be partially nonmetallic initially, it is possible to have the deposition be selective. For example, we have found that when attempting to coat a sapphire sample placed on a stainless steel holder with tantalum from $TaCl_5$ vapor and hydrogen atoms, that the tantalum only formed on the stainless steel and not on the sapphire. This appears to occur because the H radicals are more likely to react with the $Al_2O_3$ surface rather than the adsorbed monolayer of $TaCl_5$.

A similar phenomena was observed in a recent paper (P. Martensson and J-O. Carlsson, J. Electrochem. Soc. 145, 2926 (1998)) describing a thermal sequential CVD deposition of thin copper films onto platinum, but not onto glass.

A way to prevent this selectivity, when it is not desired, would be to deposit the metal oxide over the entire wafer surface. This initial monolayer of oxide could then be reduced to the pure metal with hydrogen atoms (see Example 9 above). Subsequent layers could be deposited by the direct reduction of a suitable precursor (e.g. tantalum from $TaCl_5$ and H).

The commercial applications of the films deposited by the technique of this invention should not be limited to this method of creating these films. In some instances, films grown by known sequential CVD techniques, without resort to radicals may be adequate depending on the application.

While the invention has been illustrated in particular with respect to specific methods of carrying out the same, it is apparent that variations and modifications can be made. It will be apparent from the preceding that the present invention significantly advances the state of the art in the technology of sequential chemical vapor deposition of thin films, and describes several commercially significant applications for films deposited by the method of this invention. The process of this invention is unique in that it allows, for the first time, the deposition of perfectly conformal and very pure films of any composition at low temperatures.

What is claimed is:

1. A process of growing a silicon dioxide thin film on a part in a chamber by a process comprising a plurality of deposition cycles, wherein each cycle comprises, in sequence:

introducing a first gaseous reactant comprising silicon and oxygen into the chamber, under conditions such that the first reactant adsorbs on the part in a self-limiting manner and does not form a liquid condensate on the part;

removing gases from the chamber;

exposing the part with the adsorbed first reactant to atomic oxygen, such that the atomic oxygen converts the first reactant on the part to silicon dioxide; and removing gases from the chamber, wherein the next reactant provided after exposing the part to atomic oxygen is the first gaseous reactant comprising silicon and oxygen.

2. The process of claim 1, wherein the first reactant is tetraethoxysilane.

3. The process of claim 1, wherein the atomic oxygen is generated in a radical generator in communication with the chamber.

4. The process of claim 1, wherein the atomic oxygen is generated by surrounding the chamber with an RF excitation coil.

5. The process of claim 1, wherein removing the gases from the chamber comprises flowing a purge gas over the part.

6. The process of claim 5, wherein the purge gas comprises an inert gas.

7. The process of claim 5, wherein the purge gas comprises oxygen.

8. The process of claim 7, wherein exposing the part to atomic oxygen comprises exposing the part to radicals created by a plasma discharge in the purge gas.

9. The process of claim 1, wherein more than one monolayer of silicon dioxide thin film is deposited per deposition cycle.

10. The process of claim 1, wherein the reactants in the process of growing silicon dioxide consist of the first gaseous reactant and atomic oxygen.

11. A process of growing a silicon dioxide thin film on a part in a chamber by a process comprising a plurality of deposition cycles, wherein each cycle comprises, in sequence:
    introducing gaseous tetraethoxysilane into the chamber under conditions such that the tetraethoxysilane adsorbs on the part in a self-limiting manner and does not form a liquid condensate on the part;
    removing gases from the chamber;
    exposing the part to atomic oxygen, such that the atomic oxygen converts the tetraethoxysilane on the part to silicon dioxide; and
    removing gases from the chamber.

12. The process of claim 11, wherein removing the gases from the chamber comprises flowing a purge gas comprising oxygen over the part, wherein exposing the part to atomic oxygen comprises exposing the part to radicals created by a plasma discharge in the purge gas.

13. The process of claim 11, wherein more than one monolayer of silicon dioxide thin film is deposited per deposition cycle.

14. A process of growing a silicon dioxide thin film on a part by a plurality of deposition cycles, wherein each cycle comprises, in sequence:
    exposing the part to a gaseous first reactant comprising silicon and oxygen under conditions such that the first reactant adsorbs on the part in a self-limiting manner without forming a liquid condensate;
    removing excess first reactant from the part;
    exposing the part with the adsorbed first reactant to atomic oxygen, such that the atomic oxygen converts the first reactant on the part to silicon dioxide; and
    wherein the next reactant provided after exposing the part to atomic oxygen is the first gaseous reactant comprising silicon and oxygen.

15. The method of claim 14, wherein the first reactant is tetraethoxysilane.

16. The process of claim 14, wherein removing excess first reactant from the part comprises flowing a purge gas over the part.

17. The process of claim 16, wherein the purge gas comprises an inert gas.

18. The process of claim 16, wherein exposing the part to atomic oxygen comprises exposing the part to radicals created by a plasma discharge in the purge gas.

* * * * *